United States Patent [19]

Hosokawa et al.

[11] Patent Number: 5,458,759

[45] Date of Patent: Oct. 17, 1995

[54] MAGNETRON SPUTTERING CATHODE APPARATUS

[75] Inventors: Naokichi Hosokawa; Tsukasa Kobayashi, both of Fuchu, Japan

[73] Assignee: Anelva Corporation, Tokyo, Japan

[21] Appl. No.: 223,637

[22] Filed: Apr. 6, 1994

Related U.S. Application Data

[63] Continuation-in-part of Ser. No. 917,185, Jul. 22, 1992, abandoned.

[30] Foreign Application Priority Data

Aug. 2, 1991 [JP] Japan ..................................... 3-194298
Dec. 30, 1993 [JP] Japan ..................................... 5-354024

[51] Int. Cl.$^6$ .................................................. C23C 14/35
[52] U.S. Cl. ................................ 204/298.2; 204/298.19; 204/298.09; 204/298.23
[58] Field of Search ........................... 204/298.19, 298.2, 204/298.09, 298.23, 298.25

[56] References Cited

U.S. PATENT DOCUMENTS

| | | | |
|---|---|---|---|
| 3,956,093 | 5/1976 | McLeod | 204/192.12 |
| 4,094,761 | 6/1978 | Wilson | 204/192.2 |
| 4,116,791 | 9/1978 | Zega | 427/524 |
| 4,392,939 | 7/1983 | Crombeen et al. | 204/298.19 |
| 4,407,713 | 10/1983 | Zega | 204/298.22 |
| 4,437,966 | 3/1984 | Hope et al. | 204/298.29 |
| 4,600,492 | 7/1986 | Ooshio et al. | 204/298.2 |
| 5,196,105 | 3/1993 | Feuerstein et al. | 204/298.19 |
| 5,328,585 | 7/1994 | Stevenson et al. | 204/298.2 |

FOREIGN PATENT DOCUMENTS

| | | | |
|---|---|---|---|
| 53-7586 | 1/1978 | Japan . | |
| 55-12732 | 1/1980 | Japan | 204/298.19 |
| 55-27627 | 7/1980 | Japan . | |
| 59-190364 | 10/1984 | Japan | 204/298.19 |
| 60-86272 | 5/1985 | Japan . | |
| 61-51410 | 11/1986 | Japan | 204/298.19 |
| 63-103066 | 5/1988 | Japan . | |
| 63-65754 | 12/1988 | Japan . | |
| 3-6372 | 1/1991 | Japan . | |
| 3-61367 | 3/1991 | Japan | 204/298.19 |
| 3-82759 | 8/1991 | Japan . | |
| 3-51788 | 8/1991 | Japan . | |
| 4-358064 | 12/1992 | Japan | 204/298.2 |
| 5-25625 | 2/1993 | Japan | 204/298.25 |
| 5-239640 | 9/1993 | Japan . | |

OTHER PUBLICATIONS

"Cylindrical Magnetron Sputtering," Thornton et al, 1978, Academic Press, Inc., pp. 75–113.
"Thin Film Handbook," pp. 186–189 (no translation).
"Dry Process Application Technology," pp. 63–64 (no translation).

Primary Examiner—Aaron Weisstuch

[57] ABSTRACT

A magnetron sputtering cathode apparatus has a single magnetron cathode including a magnet assembly in which first and second types of rectangular magnet units whose N and S poles are opposite are alternately disposed adjacent to each other. Two types of loop loci in which drift electron motions are directed in opposite directions are alternately formed adjacent to each other by the first and second magnet units on the surface of the target. The two types of magnet units are disposed so that a substantially common ion current generation region is formed by the first and second magnet units, thereby hybridizing drift electron orbits adjacent to each other. In a plurality of rectangular magnet units, the strength of a magnetic field formed by a central magnet and a long side portion of a peripheral magnet of the outermost magnet unit where there is no adjacent magnetic pole of opposite polarity is set to be weak so as to be equal to the strength of a magnetic field of the central magnet and a long side portion where there is an adjacent magnetic pole of opposite polarity. In a magnetic field formed by the long side portion of the peripheral magnet of the magnet unit and a long side portion of a peripheral unit adjacent to the magnet unit, the strength at an end portion of the magnetic field region is set to be weak so as to be equal to the strength of the magnetic field at other portions of the magnetic field region.

12 Claims, 9 Drawing Sheets

MAGNETRON SPUTTERING CATHODE APPARATUS

This application is a Continuation-In-Part of U.S. Pat. application Ser. No. 07/917,185, filed Jul. 22, 1992, abandoned in favor of continuation application Ser. No. 08/274,377, filed Jul. 13, 1994, now Pat. No. 5,382,344.

BACKGROUND OF THE INVENTION

The present invention relates to a magnetron sputtering cathode apparatus provided with an improved magnet assembly, which is capable of manufacturing a homogeneous thin film having a uniform thickness on the surface of a large area substrate while effectively consuming the entirety of a target surface.

In conventional magnetron sputtering cathode apparatuses, various types of cathode structures have been proposed. Among them, the magnetron cathode type is the most widely applied in industrial fabrication. The reason for this is that production is excellent due to a high film deposition rate. Various types of magnetron cathode are known. In particular, a planar magnetron cathode is most frequently used in the industrial field. Particularly, recently, formation of a homogeneous film with uniform thickness on a large substrate area is in demand for manufacturing liquid crystal display devices. For this reason, a system in which a conventional cathode is fixed in place and a substrate is continuously moved to pass in front of the cathode is applied to the magnetron sputtering cathode apparatus. For instance, the magnetron sputtering cathode apparatus shown in Japanese Patent Application Laid-Open No. 60-86272 is a typical example. However, since such an apparatus is composed of a load lock chamber, a heating chamber, a delivery buffering space, a sputtering chamber and the like, the apparatus unavoidably tends to be large. Also, since a region where no etching (erosion) is effected by ion bombardment tends to remain on the target surface, films accumulate on that region. These accumulated films would be peeled off, generating particles, which results in a reduction in production yield. Also, the conventional apparatus has various problems such as low utilization efficiency of the target caused by its non-uniform consumption, and formation of a heterogeneous film of non-uniform thickness through the sputtering process.

To solve the above-noted problems, recently, studies have been made on a magnetron sputtering cathode apparatus in which a substrate and an electrode that faces the substrate are held at a stationary position to broaden the consumption region of the target. Looking at the structure of magnets in the magnetron cathode, a magnetron sputtering cathode apparatus is shown in Japanese Patent Application Laid-Open No. 5-239640, which apparatus is provided with a magnet assembly having a structure where first and second kinds of magnets units having opposite polarity arrangements of N- and S-poles are alternatively disposed adjacent to each another. This apparatus has the following main advantages.

The selection and arrangement of the magnetic poles of a plurality of magnet units are determined so that ion current generation regions are connected to each other, whereby a cyclic locus representative of a path of the drift motion of an electron (drift electron) may be effectively arranged on the target surface. As a result, the adjacent orbits, or cyclic loci, of the drift electrons are hybridized together to form a wide band of drift electron orbit. The target surface may be subjected to considerably wide etching (erosion) by the hybridized wide band of drift electron orbit. Also, the orbits of the drift electrons that are close to and adjacent to each other are hybridized together without repulsion to thereby stably maintain the discharge on the target surface.

As a result, since the erosion region is broadened on the target surface, it is possible to enhance the utilization efficiency of the target and suppress localization of the erosion region. Also, it is possible to enhance uniformity of the thickness of the thin film formed on the substrate and the homogeneity of the film as well as suppress the particles generated due to the unwanted films being accumulated on the region when no etching (erosion) is effected on the target surface.

On the other hand, an example of the use of magnet units having a magnetic polarity mode similar to that of the above-described Japanese Patent Application Laid-Open No. 5-239640 is shown in U.S. Pat. No. 5,196,105. The electrode shown therein includes a single magnet unit in one cathode. Two cathodes of this type are disposed facing each other in a vacuum chamber and a substrate is interposed between the two electrodes for accumulating thin films. Furthermore, a pair of opposing auxiliary electrodes are disposed on an axis that intersects an axis connecting the pair of cathodes. The auxiliary electrodes are provided with two kinds of first and second magnet units whose polarity arrangements of N- and S-poles are opposite each other. The auxiliary units are usually used as anodes. However, in the disclosure of the United States patent, there is a description of the auxiliary electrodes being used as cathodes. However, there is no specific explanation at all in the case where they are used as the cathodes. Accordingly, from the disclosure, it is impossible to understand the advantages and effects thereof.

Among the prior art proposals described above, in particular, the prior art disclosed in Japanese Patent Application Laid-Open No. 5-239640 will be explained in conjunction with FIGS. 7 and 8. According to this disclosure, such an effect that the erosion region is broadened seems to be acceptable. However, the effect is not complete and the prior art has the following disadvantages.

As shown in a cross-section of FIG. 7, the two kinds of first and second magnet units 706 and 707 are arranged such that the polarities of the N-poles and S-poles oppose each other. Each magnet unit has the same dimension. In this case, the polarities of peripheral magnets 703 of the adjacent magnet units are opposite each other, and therefore, drift electron orbits generated by these units attract each other. Each magnet unit is composed of the peripheral magnets 703 and a central magnet 704. Tunnel-like magnetic lines for generating cyclic drift motion of electrons vary so that the strength of the magnetic field at a corresponding position on the surface of a target 705 decreases. As a result, a weak magnetic field portion 708 is generated as shown in FIG. 7. On the other hand, in portions of the peripheral magnets 703 of the outermost portions where the opposite polarity magnet is not located outside thereof, the strength of the magnetic field on the target surface is increased relative to the other portions. The strong magnetic fields 709 are generated as shown in FIG. 7. For this reason, in the magnetron cathode provided with the magnet assembly where a plurality of the above-described units are arranged, etching is concentrated at the portions of the target surface corresponding to the long side portions of the outermost magnet units, resulting in poor utilization efficiency of the target. Also, reflecting this, the film thickness distribution of the thin film on the substrate is non-uniform.

Furthermore, the present inventors have found that the above-described magnetic mode has another problem. FIG. 8 is a plan view of the same magnet units as those shown in FIG. 7. In FIG. 8, the strength of the magnetic field between the adjacent respective units is greater at A-portions 701 of the upper and lower end portions of the magnets than at B-portions 702 of the central portion of the magnets. This is because magnetization of the magnets that is contributable to the magnetic field of the A-portions (i.e. magnetized surface area) is larger at the upper and lower end portions of the magnets. The surface areas of the N-poles and S-poles which are contributable to the magnetic field established over the A-portions 701 are indicated by 711 and 712, respectively. On the other hand, the surface areas of the N-poles and S-poles that are contributable to the magnetic field established over the A-portions 701 in the B-portions 702 are indicated by 713 and 714, respectively. It is understood that the larger their magnetized surface area (711, 712), the higher the magnetic flux density of the magnetic field formed over an area (701), compared with that over an area (715); that is, the strength of the magnetic field increases. Due to the presence of the portions where the strength of the magnetic field is locally intensified, i.e., the A-portions, the etching effect of the target becomes non-uniform, resulting in non-uniformity of the film thickness distribution and reduction of the utilization efficiency of the target.

In the same way, it is apparent that if the electrodes shown in the above-described U.S. Pat. No. 5,196,105, are operated without any modification, the system suffers from the above-described problems.

SUMMARY OF THE INVENTION

Accordingly, an object of the present invention is to provide a magnetron sputtering cathode apparatus which improves the uniformity of the erosion distribution across a target surface, film thickness distribution, and utilization efficiency of the target in a magnet assembly where different kinds of rectangular magnet units having the polarities of the magnetic poles of the central magnets and peripheral magnets alternately arranged adjacent to each other.

In order to attain this and other objects of the invention, there is provided a magnetron sputtering cathode apparatus comprising a vacuum vessel having an evacuation system for evacuating the vacuum vessel, a substrate holding member disposed within the vacuum vessel for mounting a substrate on which a film is to be deposited, at least one magnetron cathode disposed in opposed relation to the substrate and having a rectangular planar target used to deposit the film on the surface of the substrate, a gas control system for supplying a gas to the interior of the vacuum vessel and thereby maintaining the inner pressure thereof at a predetermined value, and a power source system for supplying electrical power to the magnetron cathode, the apparatus comprising the improvement wherein the single magnetron cathode includes a magnet assembly in which first and second types of rectangular magnet units whose N and S poles are oppositely disposed are alternatively disposed adjacent to each other, two types of loop loci in which drift electron motions are directed in the opposite directions are alternatively formed adjacent to each other by the first and second magnet units on a surface of the target, the two types of magnet units are disposed so that a substantially common ion current generation region is formed by each of the first magnet unit and the second magnet unit to thereby hybridize drift electron orbits adjacent to each other, in a multiplicity of the rectangular magnet units, the strength of a magnetic field established by a central magnet and a long side portion of a peripheral magnet of the outermost magnet unit where there is no adjacent magnetic pole of opposite polarity is set to be weak so as to be equal to the strength of the magnetic field of the central magnet and a long side portion where there is an adjacent magnetic pole of opposite polarity, and in a magnetic field established by the long side portion of the peripheral magnet of the magnet unit and a long side portion of a peripheral unit adjacent to the last-mentioned magnet unit, the strength at an end portion of the magnetic field region is set to be weak so as to be equal to the strength of the magnetic field at other portions of the magnetic field region.

It is preferable that the width of the long side portion, where there is no adjacent magnetic pole of opposite polarity, of the outermost magnet unit of the plurality of rectangular magnet units in the magnetron cathode is smaller than the widths of other portions of the peripheral magnet.

It is also preferable that in the magnetron cathode, the distance between an end portion of the central magnet and the long side portion of the peripheral magnet of the magnet unit is shorter than the distance between the adjacent magnet units, and is shorter than the distance between portions of the central magnet other than the end portion and the long side portion of the peripheral magnet, and the distance between the end portion of the central magnet and a short side portion of the peripheral magnet is even shorter than the distance between the adjacent magnet units.

It is further preferable that in the magnetron cathode, a portion at the end portion of the central magnet of the magnet unit facing the short side portion of the peripheral magnet is T-shaped when viewed from above, and the distance between the T-shaped end portion of the central magnet and the portion of the peripheral magnet facing the T-shaped end portion is shorter than the distance between each adjacent magnet unit.

Preferably, in the magnetron cathode, magnetization of the long side portion, where there is no adjacent magnetic pole of opposite polarity, of the peripheral magnet of the outermost magnet unit is set to be small so that the strength of the magnetic field established by the previously mentioned long side portion and the central magnet is equal to the strength of the magnetic field established by the central magnet and the long side portion where there is an adjacent magnetic pole of opposite polarity.

Also in the magnetron cathode, the first and second magnet units are preferably disposed in proximity to each other, with a spacer interposed between the adjacent portions of the first and second magnets.

Further, the spacer is preferably made of soft steel or iron.

A water cooling jacket having a number of grooves is preferably mounted on an opposite surface of the backing plate to which the rectangular planar target is adhered, with the magnet assembly disposed in a stationary state in an atmosphere outside the water cooling jacket.

The magnet assembly is preferably disposed in the atmosphere outside the water cooling jacket through a space which allows the movement of the magnet assembly.

It is also preferable that the movable substrate holding member for supplying the substrate and the substrate holding member is held in a stationary state at a position where the substrate faces the surface of the target of the magnetron cathode during the thin film deposition process.

Also preferably, the magnetron sputtering cathode apparatus may comprise a moving mechanism including a rotational drive device, a converting mechanism for converting the rotational motion of the rotational drive device into a reciprocating motion of the magnet assembly, and a guide member for guiding the reciprocating motion of the magnet assembly.

It is further preferable that spacers made of soft magnetic material are respectively interposed in a portion between a central magnet and the long side portion, where there is no adjacent magnetic pole of opposite polarity of the peripheral magnet of the outermost magnet unit, and in an end portion in a region between the long side portion of the peripheral magnet of the magnet unit and a long side portion of a peripheral portion of a magnet unit adjacent to the above-mentioned magnet unit.

According to the structure of the magnetron sputtering cathode apparatus of the present invention, for the magnet assembly provided with a plurality of magnet units in the magnetron cathode of the rectangular planar target, the selection and arrangement of the polarities of the plurality of magnet units are suitably determined so that the ion current generation regions are coupled together. It is therefore possible to effectively arrange the loop loci representative of a path of drift electrons on the target surface for the magnet assembly as a whole. At the same time, the strength of the magnetic field established by the central magnet and the long side portion, where there is no adjacent magnetic pole of opposite polarity, of the peripheral magnet of the outermost magnet unit in the plural rectangular magnets is set to be weak so as to be equal to the strength of the magnetic field established by the central magnet and the long side portion of the peripheral magnet where the adjacent magnetic pole of opposite polarity is disposed, and in a magnetic field established by the long side portion of the peripheral magnet of the magnet unit and a long side portion of a peripheral unit adjacent to the above-mentioned magnet unit, the strength at an end portion of the magnetic field region is set to be weak so as to be equal to the strength of the magnetic field at other portions of the magnetic field region whereby the tunnel-like magnetic field distribution generating the drift electrons on the target surface may be uniform. Thus, the adjacent orbits of the drift electrons are hybridized to form a wide band of drift electron orbit. By means of the drift electron orbit created by the hybridization effect, it is possible to effectively perform etching of the target surface. The adjacent orbits of the drift electrons are joined together without repulsion, whereby the magnetron discharges are non-localized on the target surface. A coupled magnetron discharge is stabilized on the target surface as a whole. Also, a design for the arrangement and shape of the magnet is suitably performed so that the plurality of magnet units may be disposed in close relation to each other to make the magnet assembly compact. If the magnet assembly is made compact and the magnetron cathode is provided with a moving mechanism, the magnet assembly may be reciprocatingly moved substantially parallel to the rectangular planar target surface within the magnetron cathode. The amplitude or the stroke distance is set at a distance substantially corresponding to a space between the adjacent loop-like erosion regions on the target, so that the erosion region on the target may be made uniform. Also, the width of the portion of the peripheral magnet of the outermost magnet unit where there is no adjacent magnetic pole of opposite polarity is set so as to be smaller than the width of the portion where there is the adjacent magnetic pole of opposite polarity. Magnetization may be reduced there. As a result, the number of magnetic force lines of the magnetic field established by the central magnet and the long side portion having a smaller width may be reduced. Thus, uniformity in the magnetic field distribution over the entire target surface may be improved. If the width of the adjacent portions where the polarities are different from each other is suitably selected, even in the portion of the peripheral magnet where there is no adjacent magnetic pole of opposite polarity, localization may be avoided, and the tunnel-like magnetic field with which the electrons are effectively enclosed is generated.

In the magnetron cathode, the distance between an end portion of the central magnet and the long side portion of the peripheral magnet of the magnet unit is shorter than the distance between the adjacent magnet units, and is shorter than the distance between portions of the central magnet other than the end portion and the long side portion of the peripheral magnet, and the distance between the end portion of the central magnet and a short side portion of the peripheral magnet is further shorter than the distance between the adjacent magnet units, whereby it is possible to avoid local intensification of the magnetic field over the target surface. In particular, a portion at the end portion of the central magnet of the magnet unit facing the short side portion of the peripheral magnet is T-shaped when viewed from above, and the distance between the T-shaped end portion of the central magnet and the portion of the peripheral magnet facing the T-shaped end portion is shorter than the distance between each pair of adjacent magnet units. The magnetic field on the target surface, which had been locally increased at the peripheral magnet end portion between the respective magnet units, may be reduced. The reason for this will be described. Since in the peripheral magnet end portion between the respective magnet units the magnetization of the opposed magnets which are different in polarity is large relative to the other portion, the magnetic field is locally increased. Looking at the magnetic flux of the opposed magnets, the magnetic force lines departing from the N-poles of the peripheral magnet end portion are substantially introduced into the S-poles of the peripheral magnet end portions of the opposed and adjacent magnet units and are hardly introduced into the S-poles of the central magnet of the same magnet unit. Accordingly, the end portions of the central magnet of the same magnet unit facing the peripheral magnet end portions are formed to have a larger area facing the peripheral magnet, i.e. a T-shape, and the distance therebetween is made as large as possible. It is therefore possible to introduce most of the magnetic fluxes departing from the N-poles of the peripheral magnet end portions into the central magnet of the same magnet unit. With such an arrangement, the magnetic field that has increased at the end portions of the peripheral magnet between the respective magnet units may be reduced, and local intensification of the magnetic field may be avoided over the entire target surface.

Also, magnetization of the long side portion of the peripheral magnet of the outermost magnet unit where there is no adjacent magnetic pole of opposite polarity is set to be small so that the strength of the magnetic field established by the above-mentioned long side portion and the central magnet is equal to the strength of the magnetic field established by the central magnet and the long side portion where there is an adjacent magnetic pole of opposite polarity. In the same way, it is possible to avoid local intensification of the magnetic field over the entire target surface.

As described above, if local intensification of the magnetic field is relaxed, the adjacent loop-like orbits of the drift electrons may be effectively hybridized to broaden the width of the drift orbit. It is therefore possible to realize uniformity in erosion across the target, uniformity of the film thickness distribution, and enhancement of the target utilization efficiency.

DESCRIPTION OF THE PREFERRED EMBODIMENTS

Embodiments of the present invention will now be described with reference to FIGS. 1 through 6(d).

Figure 1:
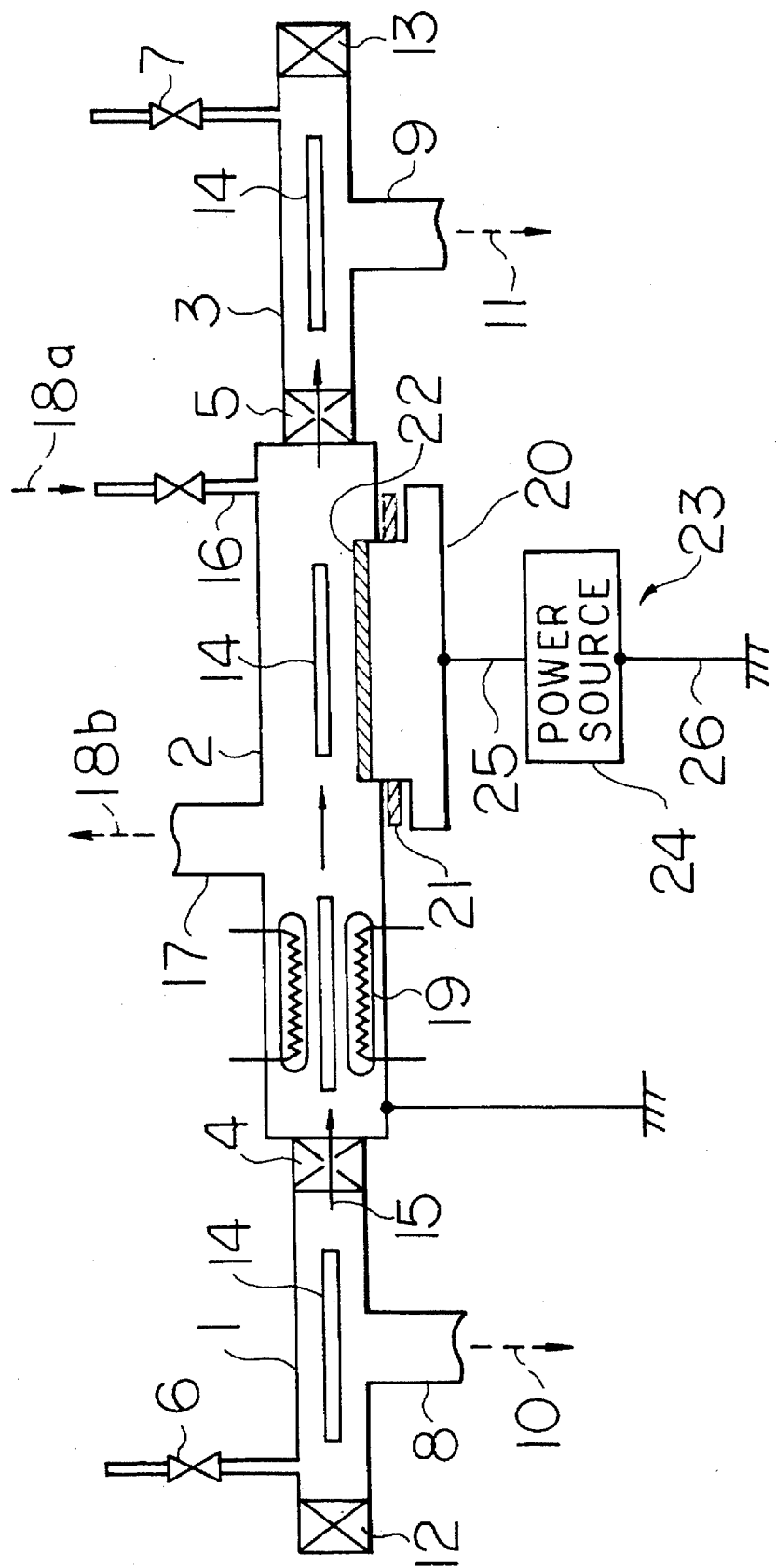
FIG. 1 is a schematic view showing the structure of a magnetron sputtering cathode apparatus in accordance with one embodiment of the invention.

Referring first to FIG. 1, a magnetron sputtering cathode apparatus includes a substrate tray loading chamber 1, a sputtering chamber 2 where a thin film is deposited on the surface of a substrate mounted on a tray, and a substrate tray unloading chamber 3. The substrate tray loading chamber 1, the sputtering chamber 2, and the substrate tray unloading chamber 3 are series-connected to each other. Each of these chambers forms a vacuum vessel which can be independently evacuated so that it can be maintained or controlled under vacuum. A gate valve 4 is provided between the substrate tray loading chamber 1 and the sputtering chamber 2, and a gate valve 5 is provided between the sputtering chamber 2 and the substrate tray unloading chamber 3.

The sputtering chamber 2 is normally maintained and controlled under vacuum. Pressure within the substrate tray loading chamber 1 can be brought up to atmospheric pressure by opening a vent valve 6. Also, pressure within the substrate tray unloading chamber 3 can be brought up to atmospheric pressure by opening a vent valve 7. The substrate tray loading chamber 1 is evacuated through an evacuation pipe 8 in the direction indicated by the arrow 10 by a vacuum pump (not shown). The substrate tray unloading chamber 3 is evacuated through an evacuation pipe 9 in the direction indicated by the arrow 11 by a vacuum pump (not shown). At the left end of the substrate tray loading chamber 1 as viewed in FIG. 1 there is provided an inlet door 12. At the right end of the substrate tray unloading chamber 3 as viewed in FIG. 1 there is provided an outlet door 13.

A tray 14 with a substrate mounted thereon is carried into the substrate tray loading chamber 1 from the inlet door 12. The tray 14 is a tool for holding at least one relatively large substrate such as a glass plate for a flat panel display. After the tray with the substrate thereon has been carried into the substrate tray loading chamber 1, the inlet door 12 and the gate valve 4 are closed and the substrate tray leading chamber 1 is evacuated by an evacuation system. When the internal pressure of the substrate tray loading chamber 1 has attained a predetermined pressure, the gate valve 4 is opened, and then the tray 14 is conveyed along a rail (not shown) in the direction indicated by the arrow 15 into the sputtering chamber 2.

In the sputtering chamber 2, a thin film is deposited by a sputtering process on the surface of the substrate placed on the tray 14. During the film deposition process on the substrate, the tray 14 remains at rest. After the thin film has been formed on the substrate, the tray 14 is sent into the substrate tray unloading chamber 3 via the gate valve 5. After the tray 14 has been sent into the substrate tray unloading chamber 3, the gate valve 5 is closed, and then the vent valve 7 is opened, whereby the substrate mounted on the tray 14 is exposed to the atmosphere. Thereafter, the outlet door 13 is opened to take the tray 14 out.

In the sputtering chamber 2, an inert gas, such as Ar gas, is introduced via a gas introducing pipe 16 in the direction indicated by the arrow 18a from a cylinder (not shown). Also, the sputtering chamber 2 is evacuated in the direction indicated by the arrow 18b via an exhaust port 17 by a vacuum pump (not shown). Thus, in a state where the flow rate of the introduction gas is balanced with that of the exhausting gas, the sputtering chamber 2 is maintained under a fixed pressure ranging from $10^{-3}$ to $10^{-2}$ Torr which is suitable for a sputtering process in the sputtering chamber 2.

Inside the sputtering chamber 2 near the inlet thereof, a substrate heating lamp 19 is provided, if necessary. The substrate heating lamp 19 radiates heat onto the substrate to heat it before a thin film formation process. At the rear stage of the sputtering chamber 2, a magnetron cathode 20 (hereinafter referred to as a "cathode" 20) having a large rectangular planar target is disposed with an insulator 21 between the sputtering chamber 2 and the cathode 20. A target assembly 22 is mounted on the upper surface of the cathode 20. The upper surface of the target assembly 22 as viewed in FIG. 1 forms a cathode surface. A power source system 23, comprising a power source 24, a power supply line 25 extending between the cathode and the power source, and a connection line 26 extending between the power source and electrical ground, is connected to the cathode 20 to supply power to the cathode 20.

In the sputtering chamber 2, the tray 14 remains at rest relative to the cathode 20. In that stationary state, the substrate on the tray 14 opposes the target surface. On the opposed surface of the substrate, particles (atoms) sputtered (ejected) from the target assembly 22 are deposited to form a thin film. In FIG. 1, a combination of a single tray 14 and a single cathode 20 is illustrated. However, a desired number of cathodes 20 may be provided in the sputtering chamber 2. The wall portion of the sputtering chamber 2 is maintained at electrical ground potential.

Figure 2:
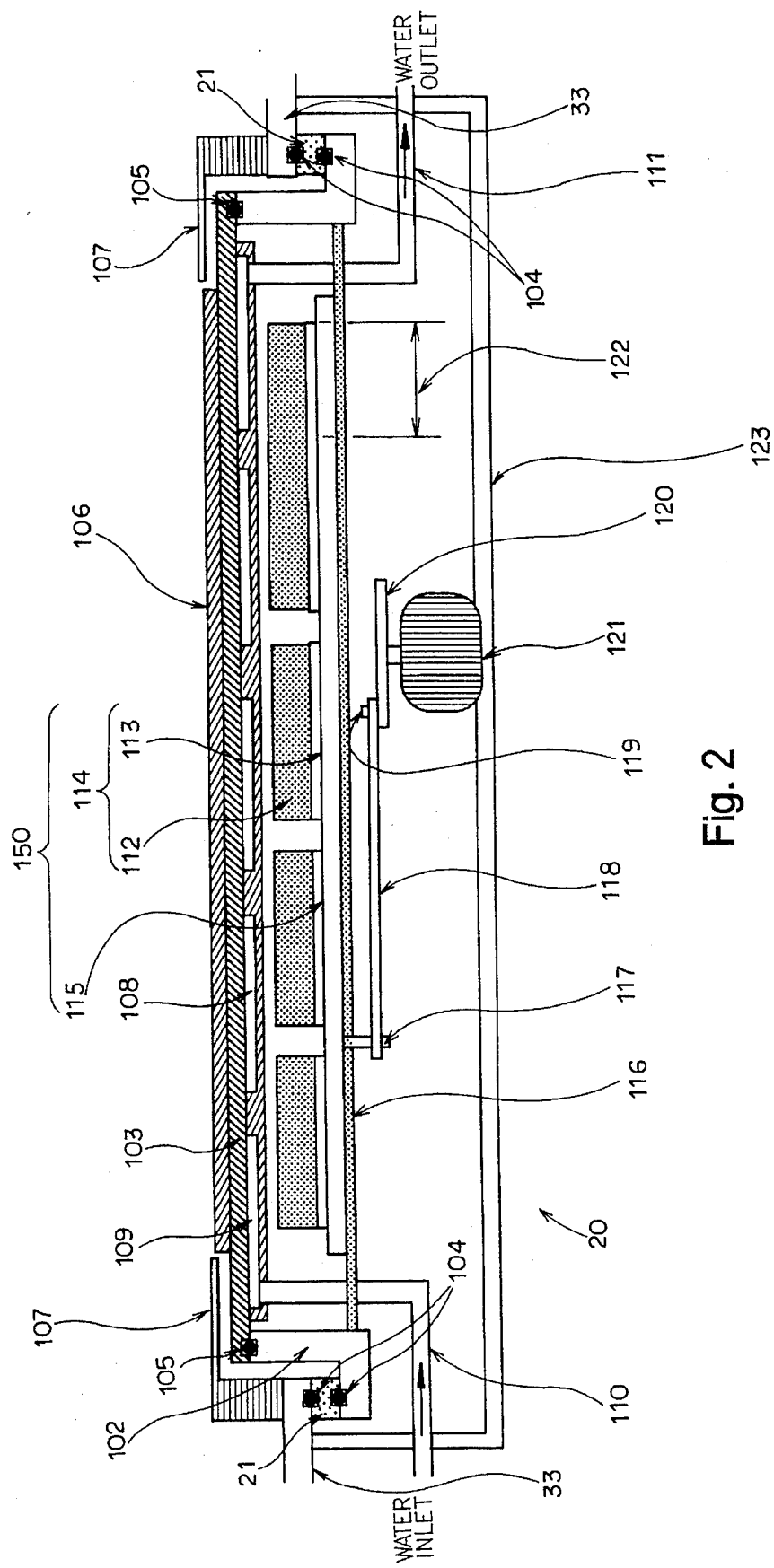
FIG. 2 is a schematic cross-sectional view showing the structure of a cathode used in the apparatus shown in FIG. 1.
Figure 3:
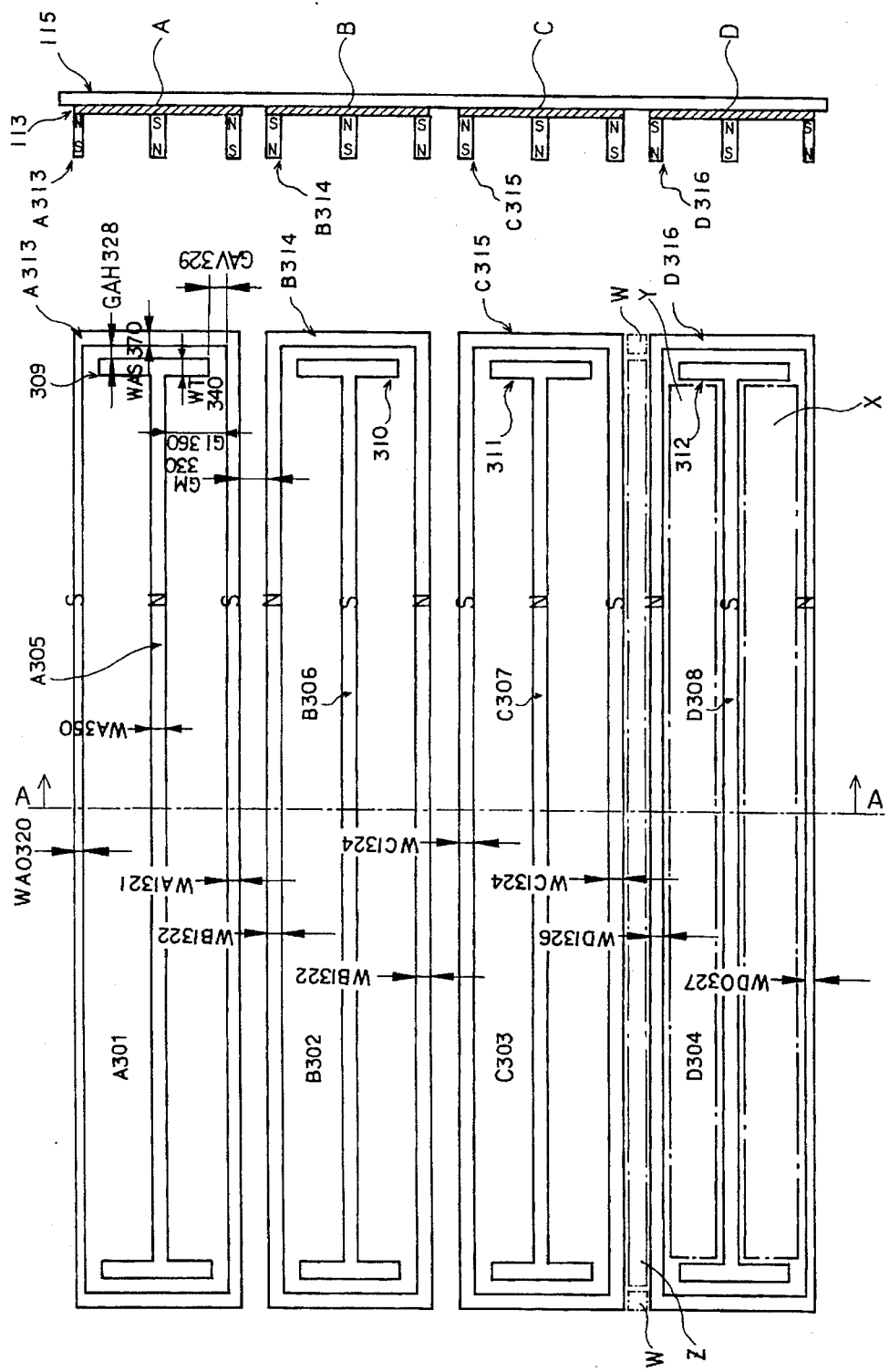
FIG. 3(a) is a plan view showing a magnet assembly in accordance with the embodiment.
FIG. 3(b) is a cross-sectional view taken along the line A—A of FIG. 3(a)
FIG. 3(c) is a cross-sectional view showing a modification where spacers are interposed between magnet units.
Figure 3:
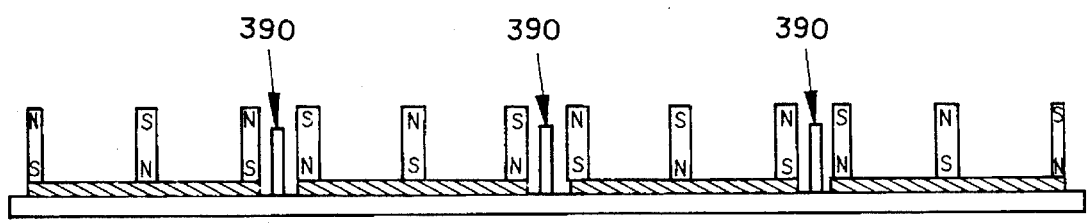

FIG. 2 is a cross-sectional view showing the structure of the cathode 20. A cathode body 102 is mounted via an insulator spacer 21 and an O-ring 104 on a part of the wall 33 of the vacuum chamber and a backing plate 103 is mounted on the cathode body 102 through an O-ring 105. The cathode body and the backing plate form a part of the chamber wall to partition the atmosphere and the vacuum chamber interior. The seal between the vacuum and the atmosphere is attained by the O-rings 104 and 105. A target 106 made of suitable material is adhered to a top surface of the backing plate 103 with a low melting point brazing material such as indium or the like. A shield 107 is provided around the target 106 for preventing parts other than the target from being etched. A water cooling jacket 108 is provided on the atmospheric side of the backing plate 103 for cooling the backing plate 103 and the target 106. A water passage 109 is provided within the water jacket 108 over the entire backing plate 103 for uniformly cooling the entirety of the backing plate 103. Cooling water is introduced into the water jacket through a water supply pipe 110 and heated water is discharged therefrom through a water discharge pipe 111. Four magnet units 114 each composed of magnets 112 and a yoke 113 are arranged behind the water cooling jacket 108. The four magnet units are fixed to a magnet base 115. A magnet assembly 150 is composed of the magnet units 114 and the magnet base 115. Furthermore, the magnet assembly 150 is movable along a guide rail 116 in the right and left directions as viewed in FIG. 2. The magnet base 115 on which the four magnet units are mounted is connected to a rotational disc 120 through a pin 117, an arm 118, and a pin 119. Also, the rotational disc 120 is coupled with a motor 121 so that it is rotated by a rotation of a shaft of the motor 121 and then the magnet assembly 150 is reciprocated right and left. Stroke distance 122 shown in FIG. 2 is equal to the diameter defined by the pin 119 provided on the rotational disc 120. A plurality of holes for fixing the pin 119 are provided in the rotational disc 120. By changing the position of the pin 119, it is possible to change the stroke distance 122 of the magnet base 115. The motor 121 is fixed to a cathode cover 123 which covers the entirety of the cathode. The cathode body 102, the backing plate 103, the target 106 and the water cooling jacket 108 are electrically connected to each other and are insulated from the other parts. Electric power is supplied to these components from the external power source 24 (FIG. 1).

Next, the structure of the magnet unit 114 will be described with reference to FIGS. 3(a) and 3(b). FIG. 3(a) is a plan view of the four magnet units. FIG. 3(b) is a cross-sectional view taken along the central line A—A of FIG. 3(a). In these figures, each magnet unit is disposed at an equal interval. Here, the magnet units are referred to as A, B, C, and D, in that order, from the upper side. Also, the central magnets, the peripheral magnets, and the yokes are distinguished from each other by using the same characters A, B, C, and D. Each magnet unit is disposed on a planar yoke having a rectangular shape viewed from above. Each magnet unit is composed of the central magnet and the peripheral magnet having a rectangular shape and disposed around the central magnet. Each end portion of the central magnet is in the form of a letter T. These magnets are fixed to the yokes with adhesives containing epoxy resin. They are made of Nd-Fe-B base material having a high magnetic coercive force and a high residual magnetic flux density. However, if it can establish a magnetic field of about 200 gauss on the target surface, any other material such as Sm-Co and the like may be used for the magnets. These four magnet units are not the same with regard to polarity mode and dimension. On the top surface of the magnets, in the magnet unit A301, the central magnet A305 has an N-pole and the peripheral magnet A313 has an S-pole, and in the adjacent magnet unit B302, the central magnet B306 has an S-pole and the peripheral magnet B314 has an N-pole. Thus, in all the magnet units, the adjacent magnet units are arranged so that the polarities of the N- and S-poles are opposite each other between adjacent magnet units. As shown in FIG. 3(b), the width WAO320 of the long side portion of the peripheral magnet A313 where there is no adjacent opposite polarity is smaller than the width WAI321 of the long side portion thereof where there is the adjacent opposite polarity. In the same manner, in the lowermost peripheral magnet D316, a width WDO327 of the long side portion where there is no adjacent opposite polarity is smaller than a width WDI326 of the long side portion where there is the adjacent opposite polarity. Here, the width WAO320 is equal to the width WDO327. Also, WAI321, WBI322, WCI324, and WDI326 are equal to each other. The width of a portion which faces the end portion of the central magnet in the form of the letter T, i.e. a width WAS370 of the short side portion, is set constant in all the magnet units A to D. The distance between the end portion 309 of the central magnet A and the facing peripheral magnet A313, the width GAH328 and the width GAV329 are equal to each other and are set to be smaller than the interval GM330 between adjacent magnet units. Also, in the other magnet units B, C, and D, the interval between the end portion of the central magnet and the peripheral magnet is equal to the widths GAH328 and GAV329. Except for the dimension of the long side portions of the magnet units A301 and D304 where there is no adjacent opposite polarity magnet, the dimension of each magnet unit is the same.

The widths GAH328 and GAV329 are both 11 mm. The width GM330 is 19 mm. The width GI360 is 39.5 mm. Also, the widths WAO320 and WDO327 are 6 mm, and the widths of WAI321 and WAS370 are 9 mm. The width WT340 of the T-shaped end portion of the central magnet is set at 10 mm. Also, the width WA350 of the central magnet is set at 10 mm.

With the thus arranged magnets, the strength of the magnetic field established by the central magnet of the magnet unit and the long side portion of the peripheral magnet of the magnet unit where there is no adjacent opposite polarity (X portion) is set to be weak so as to be equal to the strength of the magnetic field established by the central magnet and the long side portion where there is adjacent opposite polarity (Y portion), and the strength of the end portions of the magnetic field (W portion) of the magnetic field established by the long side portion of the peripheral magnet of the magnet unit and the long side portion of the peripheral magnet of the adjacent magnet unit is set to be weak so as to be equal to the strength of the other portions of the magnetic field (Z portion).

The magnet assembly is completed by using a plurality of such magnet units. FIG. 3(c) is a cross-sectional view showing the structure of another example of the magnet assembly. In this example, shunt spacers 390 are interposed between the adjacent magnet units. The shunt spacers 390 are made of a material such as soft steel or iron having high magnetic permeability. The shunt spacers 390 serve to reduce the magnetic field strength at the target surface position between the magnet units when the adjacent magnet units having different polarities from each other are arranged in close proximity. The magnetic field generated at this position induces drift motion of electrons but since this motion does not trace an endless loop, the motion is not contributable to the etching of the target. The shunt spacer 390 has the advantages of reducing the magnetic field, producing a stable discharge, and enhancing the utilization efficiency of the target.

Figure 4:
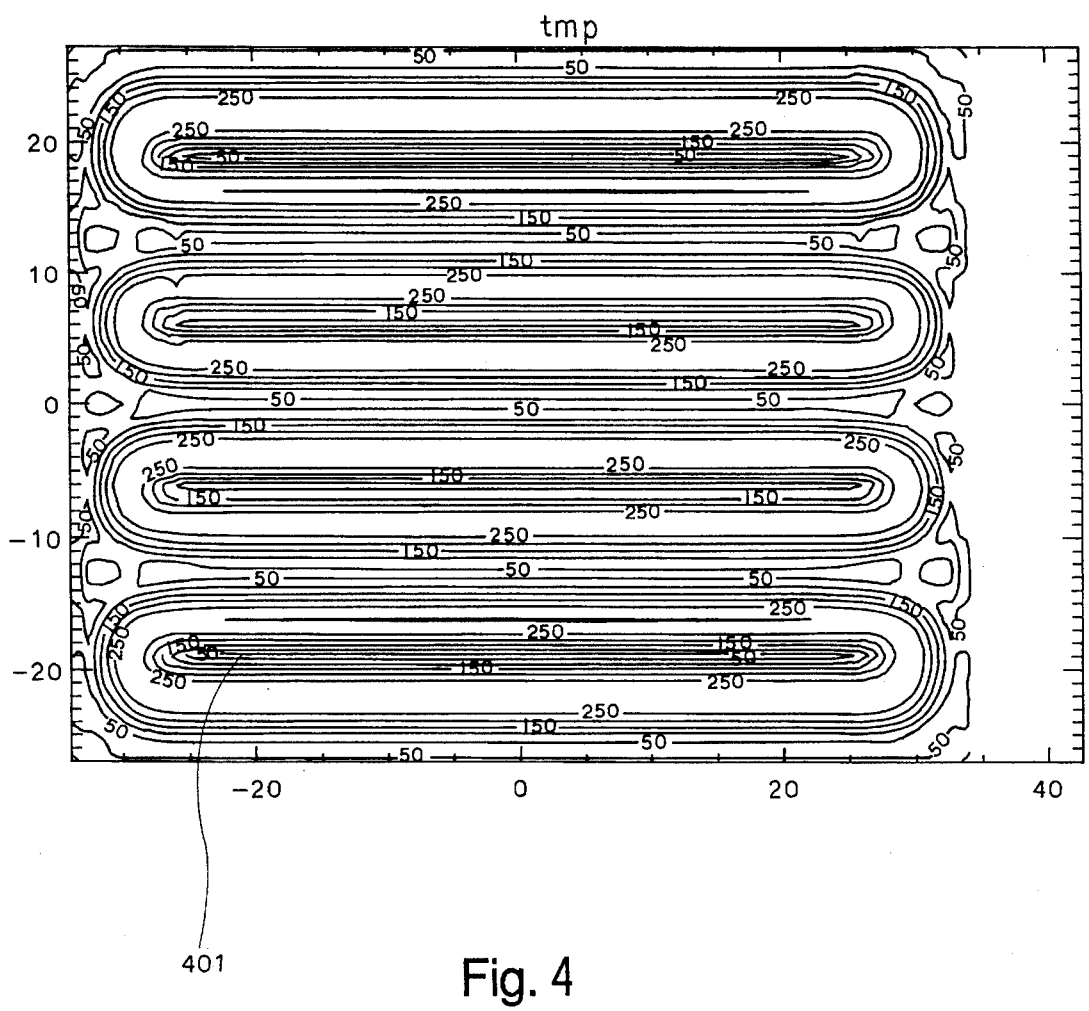
FIG. 4 shows the distribution of the component parallel to the target surface in the magnetic field generated from the magnet assembly shown in FIGS. 3(a) and 3(b) or 3(c), on the target surface.

Thus, it is possible to generate a tunnel-like magnetic field to effectively enclose the electrons. The magnetic field generated on the target surface by the magnet assembly composed of the magnet units shown in FIGS. 3(a) to 3(b) determines the distribution of the electrons and the ion current density. Since the magnetic field component parallel to the target surface in the magnetic field on the target directly affects the electron drift directed to the electric field and the magnetic field, i.e. an $\vec{E} \times \vec{B}$ drift, the distribution of the magnetic field is an important factor in determining erosion distribution across the target. FIG. 4 shows the distribution of the magnetic field component parallel to the surface of the target, generated from the magnet assembly having the structure shown in FIGS. 3(a) and 3(b) or 3(c) at the position of the target surface. In this diagram, FIG. 4 shows contour lines of the absolute values of the magnetic field component parallel to the target surface at intervals of 50 gauss. From FIG. 4, it is apparent that in the distribution of the magnetic field component parallel to the target surface, positions taking the maximum value form four loop tracks 401, and the width of the four tracks pictured with contour lines of 250 gauss or more is kept the substantially the same as that of the other. Furthermore, the magnetic field of the A portion 701 was 250 gauss or more in the conventional system, but has been decreased to within the range of 50 to 100 gauss.

Figure 5:
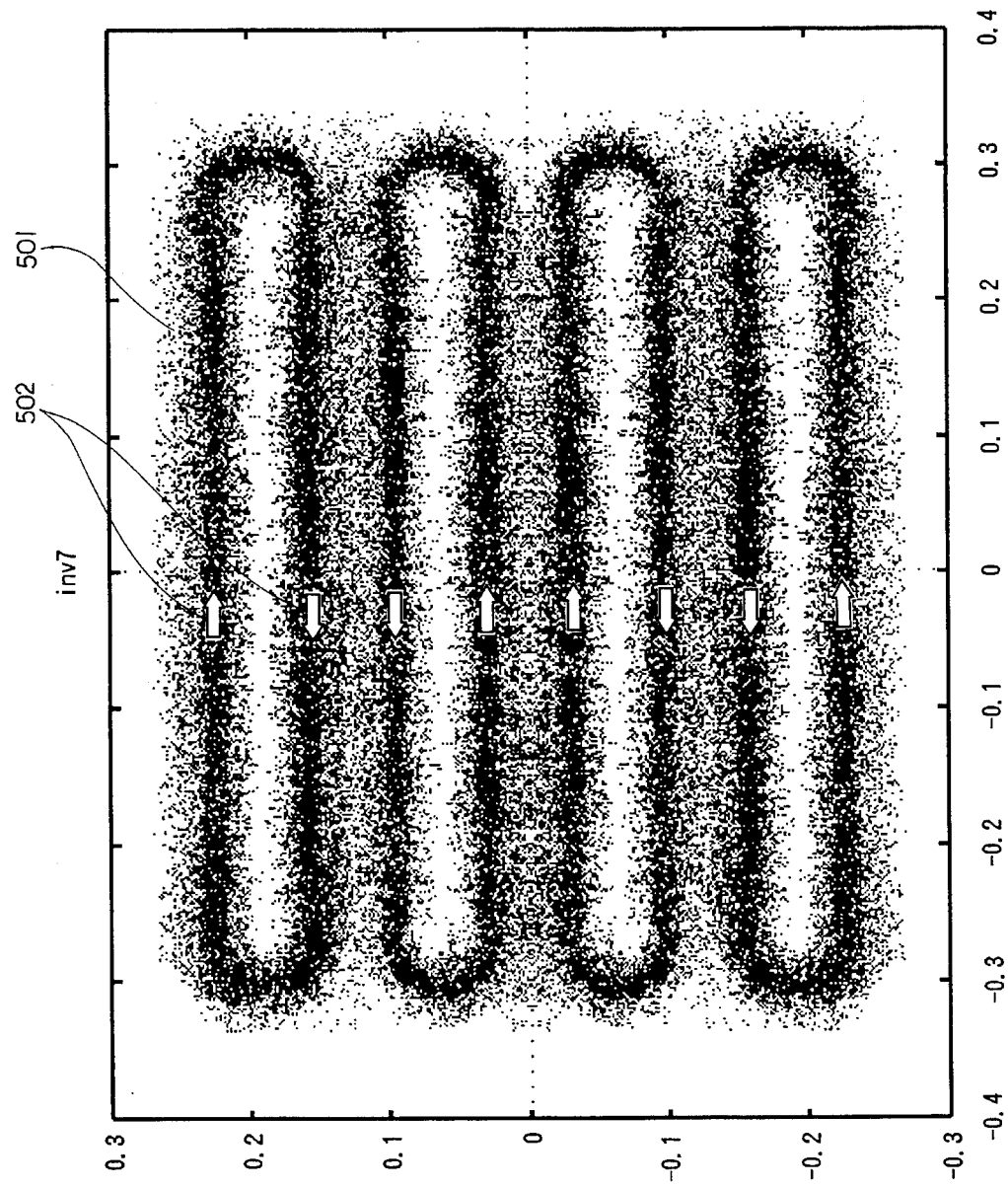
FIG. 5 shows the etching distribution, presented in light and shade, of the target generated in the case where the apparatus according to the embodiment was used, the heavier portion indicating deeper erosion.
Figure 6:
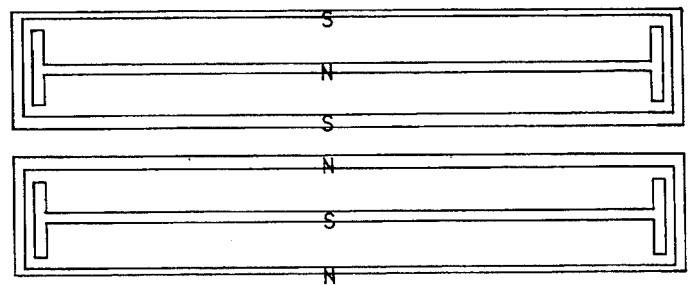
FIG. 6(a) is a plan view showing another embodiment relating to the magnet assembly used in the magnetron sputtering cathode apparatus according to the present invention, wherein two magnet units are used.
FIG. 6(b) is a plan view showing another embodiment relating to the magnet assembly used in the magnetron sputtering cathode apparatus according to the present invention, wherein three magnet units are used.
FIG. 6(c) is a plan view showing another embodiment relating to the magnet assembly used in the magnetron sputtering cathode apparatus according to the present invention, wherein five magnet units are used.
FIG. 6(d) is a plan view showing another embodiment relating to the magnet assembly used in the magnetron sputtering cathode apparatus according to the present invention, wherein six magnet units are used.
Figure 6:
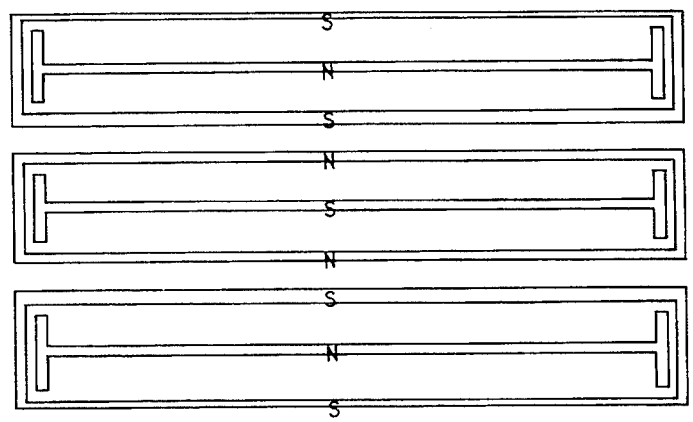
Figure 6:
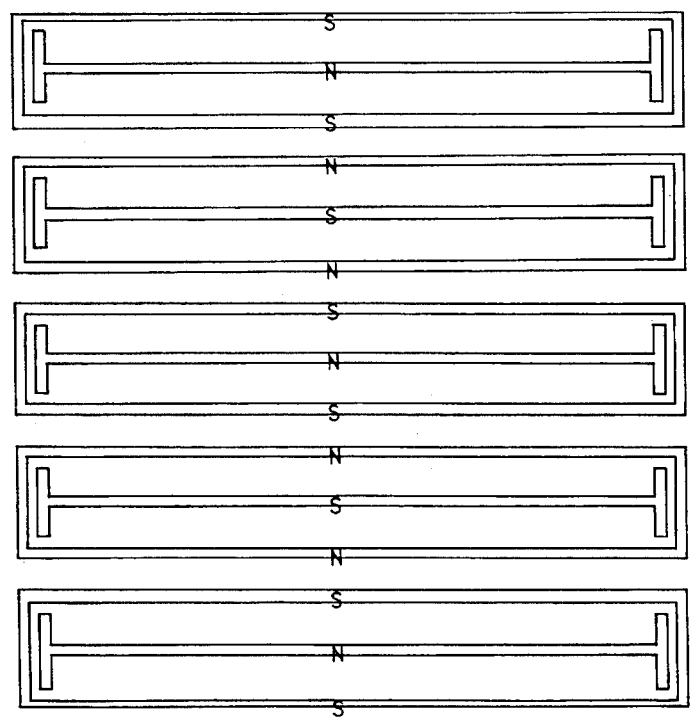
Figure 6:
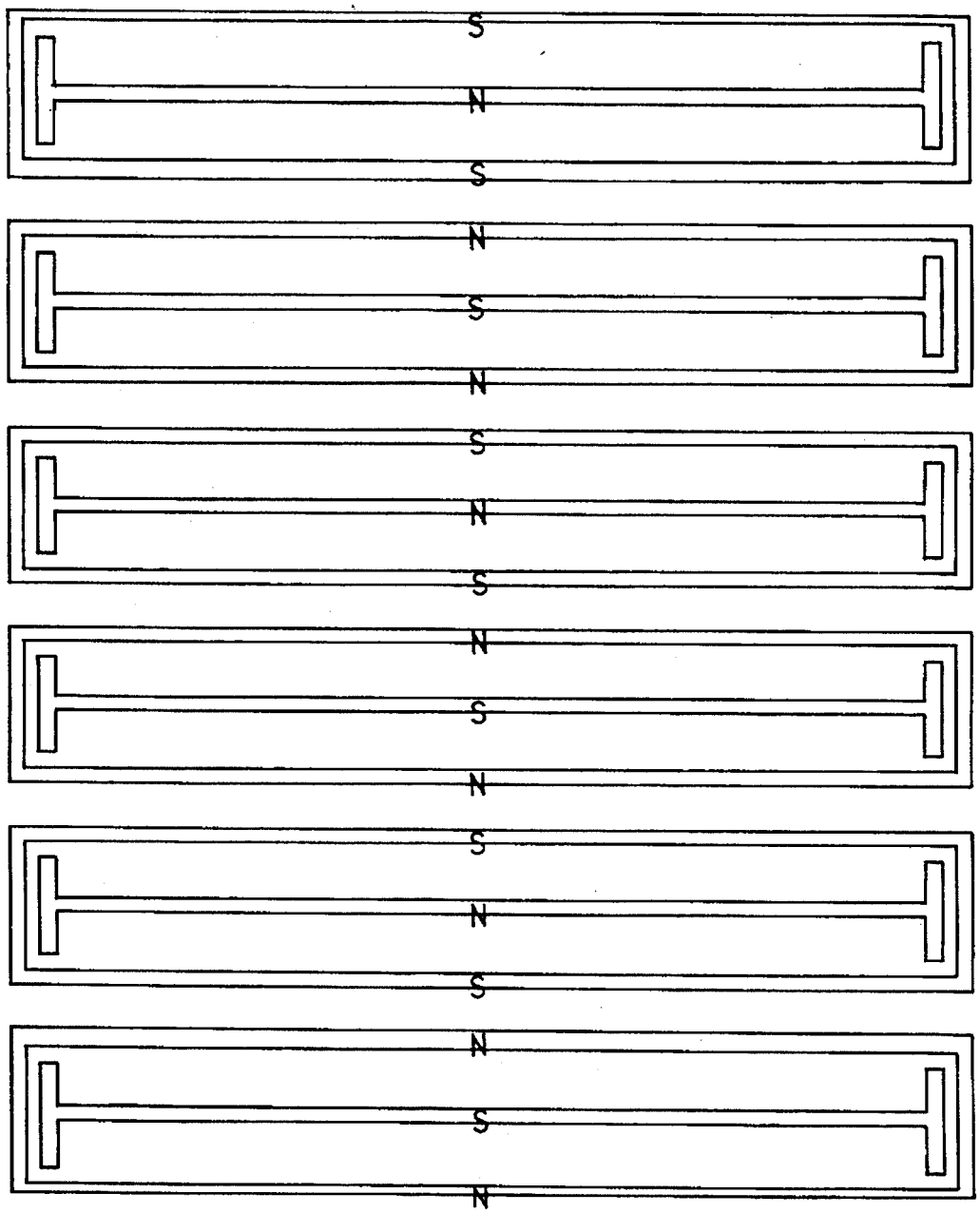
Figure 7:
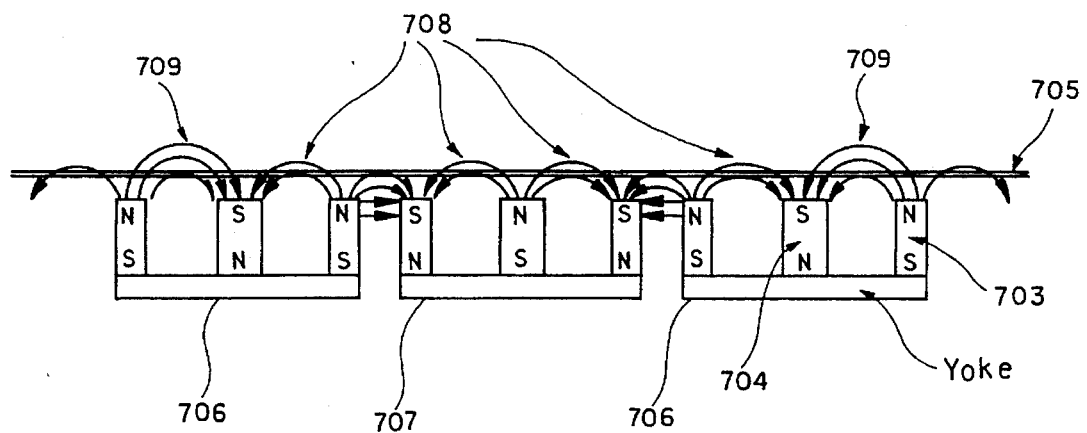
FIG. 7 is a cross-sectional view showing the structure of a cathode used in a conventional magnetron sputtering cathode apparatus.
Figure 8:
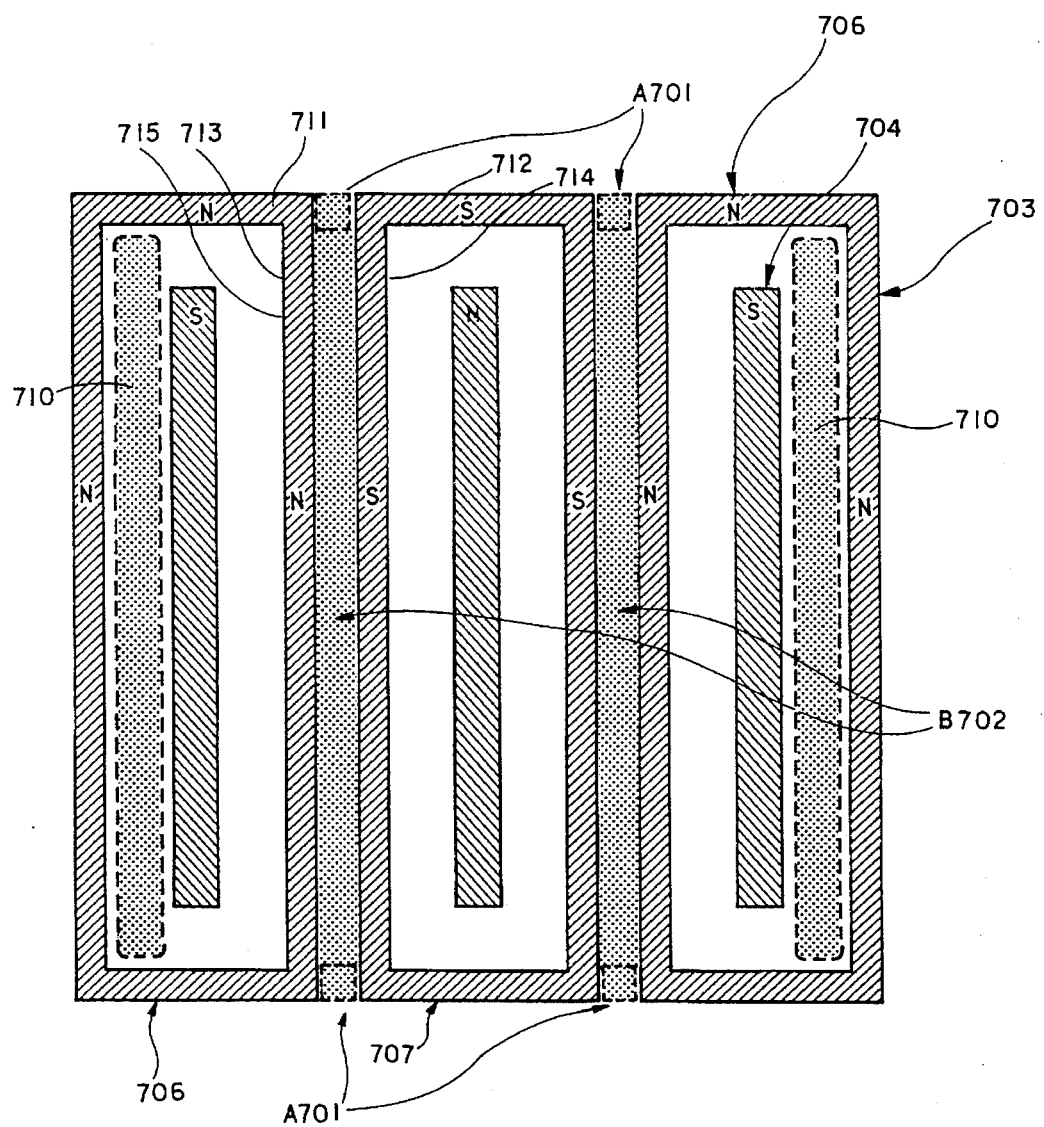
FIG. 8 is a plan view showing the structure of the cathode shown in FIG. 7.

FIG. 5 shows the erosion distribution of the target in light and shade in the case where the sputtering film formation was carried out under the condition that the magnet assembly 150 was held in a stationary state without rotating the motor 121 shown in FIG. 2. In FIG. 5, the heavy portion indicates the portion where the target was deeply etched. The pressure of the sputtering treatment was kept at 10 mTorr. As is apparent from FIG. 5, the erosion patterns of the four tracks are formed very similarly without any locally intense deep erosion regions of the loop tracks 501 compared to the other. It is understood that a rather remarkable erosion region was generated also in the intermediate portions between the adjacent track-like erosion regions. In this case, because the direction 502 of the electron drift of adjacent tracks was kept the same, and the orbits of the electrons of the adjacent tracks are hybridized to broaden the erosion region of the target and to enhance the utilization efficiency of the target, even if the magnets were held in a stationary state, it was possible to enhance the utilization efficiency of the target 30% or more.

Furthermore, the motor 121 shown in FIG. 2 was driven at a speed of about 60 rpm, and the magnet assembly 150 as a whole was reciprocated right and left. In this case, the stroke distance was suitably set by selecting the positions of the pin 119 on the rotational disc so that the stroke distance was substantially equal to the width of the central portion which was not subjected to etching in the loop-like track. The reciprocal motion caused etching to occur over the entire surface of the target to enhance the utilization efficiency of the target up to about 60%. Also, in correspondence with this, a distribution of film having the good uniformity and homogeneity of film was obtained.

In the foregoing embodiments, the single magnet assembly is composed of the four magnet units. It is however apparent that the present invention is not limited to this arrangement. Needless to say, the teachings of the present invention may be applied to a case wherein two magnet units,are used as shown in FIG. 6(a), a case wherein three magnet units are used as shown in FIG. 6(b), a case wherein five magnet units are used as shown in FIG. 6(c), a case wherein six magnet units are used as shown in FIG. 6(d), and a case wherein a higher number of magnet units are used in combination.

In another embodiment, it is apparent to those skilled in the art to modify the present invention so that the magnetization of the magnets is adjusted to ensure the above-described effects and advantages. As to how to adjust the magnetization of the magnets, it is most suitable to set the magnetization so that, in the magnetron cathode, the strength of the magnetic field of the long side portions of the peripheral magnets of the outermost magnet units where there are no opposite adjacent polarities is equal to the strength of the magnetic field established by the central magnets and the long side portions where there are adjacent opposite polarities. Furthermore, in still another embodiment, spacers are interposed in the portion 710 between the central magnet and the long side portion of the peripheral magnet of the outermost magnet unit, and in the portion 701 between the long side portion of the peripheral magnet of the magnet unit and the long side portion of the outer peripheral magnet of the adjacent magnet unit. It is possible to weaken the magnetic fields established over the portion 710 and the portion 701 by interposing spacers made of soft magnetic material in the portions 710 an 701. The magnetic permeability and/or shape of the spacers disposed in the portions 710 and 701 are adjusted so that the strength of the magnetic field established by the central magnet and the long side portion of the peripheral magnet of the magnet unit where there is no adjacent opposite polarity is weakened so as to be equal to the strength of the magnetic field established by the central magnet and the long side portion where there is the adjacent opposite polarity, and the strength of the end portion of the magnetic field region in the magnetic field formed by the long side portion of the peripheral magnet of the magnet unit and the long side portion of the peripheral magnet of the adjacent magnet unit may be set to be weakened so as to be equal to the strength of the magnetic field of the other portion. It is most preferable to use soft steel or iron for the soft magnetic material.

As mentioned above, according to the present invention, the adjacent two electron drift orbits are hybridized to thereby generate a wide ion current generation region to broaden the erosion region on the target surface. In addition, the loop-like etching tracks generated at this time are not localized, and the reciprocal motion of the magnets may be used to thereby consume the target uniformly to realize a considerable improvement in utilization coefficient of the target. Also hence it is possible to improve the uniformity of the thin film distribution and the homogeneity of the thin film.

What is claimed is:

1. A magnetron sputtering cathode apparatus comprising:

a vacuum vessel having an evacuation system for evacuating said vacuum vessel;

a substrate holding member disposed within said vacuum vessel for mounting a substrate on which a film is to be deposited;

at least one magnetron cathode disposed in opposed relation to the substrate and having a rectangular planar target used to deposit the film on a surface of the substrate;

a gas control system for supplying a gas to an interior of said vacuum vessel to thereby maintain an inner pressure thereof at a predetermined value; and a power source system for supplying electrical power to said magnetron cathode;

said apparatus being characterized by the improvement wherein the magnetron cathode includes a magnet assembly in which a plurality of rectangular magnet units of first and second types whose N and S poles are oppositely disposed are alternately disposed adjacent to each other, whereby two types of loop loci in which drift electron motions are directed in opposite directions are alternately formed adjacent to each other by said first and second magnet units on a surface of said target;

said two types of magnet units being disposed so that a substantially common ion current generation region is formed by said first type magnet unit and said second type magnet unit, thereby hybridizing drift electron orbits adjacent to each other;

in the plurality of rectangular magnet units, the strength of the magnet is field established by a central magnet and a long side portion of a peripheral magnet of the outermost magnet units where there is no adjacent magnetic pole of opposite polarity is set to be weak so as to be equal to a strength of the magnetic field of the central magnet and the long side portion where there is an adjacent magnetic pole of opposite polarity; and in the magnetic field established by the long side portion of the peripheral magnet of the magnet unit and a long side portion of a peripheral unit adjacent to the last-mentioned magnet unit, the strength at an end portion of the magnetic field region is set to be weak so as to be equal to that of the magnetic field at other portions of the magnetic field region.

2. The magnetron sputtering cathode apparatus according to claim 1, wherein the width of the long side portion of the outermost magnet unit of the plurality of rectangular magnet units in said magnetron cathode where there is no adjacent magnetic pole of opposite polarity is smaller than the width of other portions of the peripheral magnet.

3. The magnetron sputtering cathode apparatus according to claim 1, wherein in said magnetron cathode, an end portion of the central magnet and the long side portion of the peripheral magnet of a magnet unit are shorter that the distance between the adjacent magnet units, and are shorter than the distance between a portion of the central magnet other than the end portion and the long side portion of the peripheral magnet, and the distance between the end portion of the central magnet and the short side portion of the peripheral magnet is further shorter than the distance between the adjacent magnet units.

4. The magnetron sputtering cathode apparatus according to claim 3, wherein in the magnetron cathode, the portion at the end portion of the central magnet of the magnet unit facing the short side portion of the peripheral magnet is T-shaped viewed from above, and the distance between the T-shaped end portion of the central magnet and the portion of the peripheral magnet facing the T-shaped end portion is shorter than the distance between each pair of adjacent magnet units.

5. The magnetron sputtering cathode apparatus according to claim 1, wherein in the magnetron cathode, the magnetization of the long side portion of the peripheral magnet of the outermost magnet unit where there is no adjacent magnetic pole of opposite polarity is set to be small so that the strength of the magnetic field formed by the long side portion and the central magnet is equal to the strength of the magnetic field formed by the central magnet and the long side portion where there is the adjacent magnetic pole of opposite polarity.

6. The magnetron sputtering cathode apparatus according to claim 1, wherein in the magnetron cathode, said first and second magnet units are disposed in proximity to each other, and a spacer is interposed between the said first and second magnet units.

7. The magnetron sputtering cathode apparatus according to claim 6, wherein said spacer is made of soft steel or iron.

8. The magnetron sputtering cathode apparatus according to claim 1, wherein a water cooling jacket having a number of grooves is mounted on an opposite surface of a backing plate to which said rectangular planar target is adhered, and said magnet assembly is disposed in a stationary state in the atmosphere outside said water cooling jacket.

9. The magnetron sputtering cathode apparatus according to claim 1, wherein a water cooling jacket having a number of grooves is mounted on an opposite surface of a backing plate to which said rectangular planar target is adhered, and said magnet assembly is disposed in the atmosphere outside said water cooling jacket through a space which allows movement of the magnet assembly.

10. The magnetron sputtering cathode apparatus according to claim 9, further comprising a moving mechanism including a rotational drive means, a converting mechanism for converting rotational motion by said rotational drive means into reciprocating motion of said magnet assembly, and a guide member for guiding the reciprocating motion of said magnet assembly.

11. The magnetron sputtering cathode apparatus according to claim 1, wherein said substrate holding member is movable and is adapted to be held in a stationary state at a position where the substrate faces the surface of the target of said magnetron cathode during thin film deposition thereon.

12. The magnetron sputtering cathode apparatus according to claim 1, wherein spacers made of soft magnetic material are interposed between the central magnet and the long side portion of the peripheral unit of the outermost magnet unit where there is no adjacent magnetic pole of opposite polarity, and at an end portion between the long side portion of the peripheral magnet of the magnet unit and the long side portion of a peripheral portion of a magnet unit adjacent to the last-mentioned magnet unit.

* * * * *